(12) United States Patent
Kimura et al.

(10) Patent No.: US 8,531,346 B2
(45) Date of Patent: Sep. 10, 2013

(54) WIRELESS IC DEVICE

(75) Inventors: Mikiko Kimura, Otsu (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 415 days.

(21) Appl. No.: 12/510,338

(22) Filed: Jul. 28, 2009

(65) Prior Publication Data

US 2009/0278760 A1   Nov. 12, 2009

Related U.S. Application Data

(63) Continuation of application No. PCT/JP2008/056026, filed on Mar. 28, 2008.

(30) Foreign Application Priority Data

Apr. 26, 2007   (JP) ................................. 2007-117460

(51) Int. Cl.
| | |
|---|---|
| *H01Q 1/50* | (2006.01) |
| *H01Q 9/16* | (2006.01) |
| *H01Q 1/38* | (2006.01) |
| *H01Q 19/00* | (2006.01) |
| *H01Q 19/10* | (2006.01) |
| *H01Q 9/28* | (2006.01) |

(52) U.S. Cl.
USPC .... 343/860; 343/850; 343/793; 343/700 MS; 343/833; 343/834; 343/795

(58) Field of Classification Search
USPC ....................................................... 343/860
See application file for complete search history.

(56) References Cited

U.S. PATENT DOCUMENTS

| | | | |
|---|---|---|---|
| 3,364,564 | A | 1/1968 | Kurtz et al. |
| 4,794,397 | A | 12/1988 | Ohe et al. |
| 5,232,765 | A | 8/1993 | Yano et al. |
| 5,253,969 | A | 10/1993 | Richert |
| 5,337,063 | A | 8/1994 | Takahira |
| 5,374,937 | A | 12/1994 | Tsunekawa et al. |
| 5,399,060 | A | 3/1995 | Richert |

(Continued)

FOREIGN PATENT DOCUMENTS

| | | |
|---|---|---|
| CA | 2 279 176 A1 | 7/1998 |
| DE | 10 2006 057 369 A1 | 6/2008 |

(Continued)

OTHER PUBLICATIONS

"Maximum Power Transfer," James Nilsson, et al, Electric Circuits, $6^{th}$ Edition, 2001, pp. 512-514.*

(Continued)

*Primary Examiner* — Jacob Y Choi
*Assistant Examiner* — Graham Smith
(74) *Attorney, Agent, or Firm* — Keating & Bennett, LLP

(57) ABSTRACT

A wireless IC device includes a wireless IC chip; a feeder circuit board which has the wireless IC chip located thereon, is magnetically coupled to a radiation plate, supplies electric power to the wireless IC chip, and relays signals between the wireless IC chip and the radiation plate; and a substrate on which the feeder circuit board is placed. On the substrate, there are formed a plurality of positioning markers indicating the boundaries of a plurality of positioning areas in which the feeder circuit board is selectively placed.

12 Claims, 6 Drawing Sheets

(56) References Cited

U.S. PATENT DOCUMENTS

| | | |
|---|---|---|
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1* | 1/2001 | Beigel ............... 343/741 |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,288,905 B1* | 9/2001 | Chung ................ 361/771 |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,396,458 B1* | 5/2002 | Cockson et al. ........ 343/860 |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0079132 A1 | 6/2002 | Terashima |
| 2002/0093457 A1 | 7/2002 | Hamada et al. |
| 2003/0006901 A1 | 1/2003 | Kim et al. |
| 2003/0017890 A1* | 1/2003 | McDonald et al. ........ 473/407 |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0052333 A1* | 3/2005 | Rao et al. .............. 343/840 |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0043198 A1 | 3/2006 | Forster |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0046466 A1* | 3/2007 | Sakama et al. ............ 340/572.1 |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0070003 A1 | 3/2008 | Nakatani et al. |
| 2008/0087990 A1 | 4/2008 | Kato et al. |
| 2008/0143630 A1 | 6/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0321527 A1 | 12/2009 | Kato et al. |
| 2010/0103058 A1 | 4/2010 | Kato et al. |
| 2011/0031320 A1 | 2/2011 | Kato et al. |
| 2011/0063184 A1 | 3/2011 | Furumura et al. |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 220 597 A1 | 7/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |

| | | | | | | |
|---|---|---|---|---|---|---|
| EP | 1 988 491 | A1 | 11/2008 | JP | 2000-085283 A | 3/2000 |
| EP | 1 988 601 | A1 | 11/2008 | JP | 2000-090207 A | 3/2000 |
| EP | 1 993 170 | A1 | 11/2008 | JP | 2000-132643 A | 5/2000 |
| EP | 2 009 738 | A1 | 12/2008 | JP | 2000-137778 A | 5/2000 |
| EP | 2 012 258 | A1 | 1/2009 | JP | 2000-137779 A | 5/2000 |
| EP | 2 096 709 | A1 | 9/2009 | JP | 2000-137785 A | 5/2000 |
| EP | 2 148 449 | A1 | 1/2010 | JP | 2000-148948 A | 5/2000 |
| EP | 2 251 934 | A1 | 11/2010 | JP | 2000-172812 A | 6/2000 |
| GB | 2 305 075 | A | 3/1997 | JP | 2000-209013 A | 7/2000 |
| GB | 2461443 | A | 1/2010 | JP | 2000-222540 A | 8/2000 |
| JP | 50-143451 | A | 11/1975 | JP | 2000-510271 A | 8/2000 |
| JP | 61-284102 | A | 12/1986 | JP | 2000-242754 A | 9/2000 |
| JP | 62-127140 | U | 8/1987 | JP | 2000-243797 A | 9/2000 |
| JP | 02-164105 | A | 6/1990 | JP | 2000-251049 A | 9/2000 |
| JP | 02-256208 | A | 10/1990 | JP | 2000-261230 A | 9/2000 |
| JP | 03-503467 | A | 8/1991 | JP | 2000-276569 A | 10/2000 |
| JP | 03-262313 | A | 11/1991 | JP | 2000-286634 A | 10/2000 |
| JP | 04-150011 | A | 5/1992 | JP | 2000-286760 A | 10/2000 |
| JP | 04-167500 | A | 6/1992 | JP | 2000-311226 A | 11/2000 |
| JP | 04-096814 | U | 8/1992 | JP | 2000-321984 A | 11/2000 |
| JP | 04-101168 | U | 9/1992 | JP | 2000-349680 A | 12/2000 |
| JP | 04-134807 | U | 12/1992 | JP | 2001-10264 A | 1/2001 |
| JP | 05-327331 | A | 12/1993 | JP | 2001-028036 A | 1/2001 |
| JP | 6-53733 | A | 2/1994 | JP | 2001-043340 A | 2/2001 |
| JP | 06-077729 | A | 3/1994 | JP | 3075400 U | 2/2001 |
| JP | 06-177635 | A | 6/1994 | JP | 2001-66990 A | 3/2001 |
| JP | 6-260949 | A | 9/1994 | JP | 2001-76111 A | 3/2001 |
| JP | 07-183836 | A | 7/1995 | JP | 2001-084463 A | 3/2001 |
| JP | 08-055725 | A | 2/1996 | JP | 2001-101369 A | 4/2001 |
| JP | 08-056113 | A | 2/1996 | JP | 2001-505682 A | 4/2001 |
| JP | 8-87580 | A | 4/1996 | JP | 2001-168628 A | 6/2001 |
| JP | 08-88586 | A | 4/1996 | JP | 2001-188890 A | 7/2001 |
| JP | 08-088586 | A | 4/1996 | JP | 2001-240046 A | 9/2001 |
| JP | 08-176421 | A | 7/1996 | JP | 2001-256457 A | 9/2001 |
| JP | 08-180160 | A | 7/1996 | JP | 2001-257292 A | 9/2001 |
| JP | 08-279027 | A | 10/1996 | JP | 2001-514777 A | 9/2001 |
| JP | 08-307126 | A | 11/1996 | JP | 2001-319380 A | 11/2001 |
| JP | 08-330372 | A | 12/1996 | JP | 2001-331976 A | 11/2001 |
| JP | 09-014150 | A | 1/1997 | JP | 2001-332923 A | 11/2001 |
| JP | 09-035025 | A | 2/1997 | JP | 2001-339226 A | 12/2001 |
| JP | 09-093029 | A | 4/1997 | JP | 2001-344574 A | 12/2001 |
| JP | 9-93029 | A | 4/1997 | JP | 2001-351083 A | 12/2001 |
| JP | 09-245381 | A | 9/1997 | JP | 2001-351084 A | 12/2001 |
| JP | 09-252217 | A | 9/1997 | JP | 2001-352176 A | 12/2001 |
| JP | 09-270623 | A | 10/1997 | JP | 2002-015295 A | 1/2002 |
| JP | 09-284038 | A | 10/1997 | JP | 2002-024776 A | 1/2002 |
| JP | 9-512367 | A | 12/1997 | JP | 2002-026513 A | 1/2002 |
| JP | 10-069533 | A | 3/1998 | JP | 2002-32731 A | 1/2002 |
| JP | 10-69533 | A | 3/1998 | JP | 2002-042076 A | 2/2002 |
| JP | 10-505466 | A | 5/1998 | JP | 2002-063557 A | 2/2002 |
| JP | 10-171954 | A | 6/1998 | JP | 2002-505645 A | 2/2002 |
| JP | 10-173427 | A | 6/1998 | JP | 2002-076750 A | 3/2002 |
| JP | 10-193849 | A | 7/1998 | JP | 2002-76750 A | 3/2002 |
| JP | 10-193851 | A | 7/1998 | JP | 2002-111363 A | 4/2002 |
| JP | 10-293828 | A | 11/1998 | JP | 2002-150245 A | 5/2002 |
| JP | 10-334203 | A | 12/1998 | JP | 2002-157564 A | 5/2002 |
| JP | 11-025244 | A | 1/1999 | JP | 2002-158529 A | 5/2002 |
| JP | 11-039441 | A | 2/1999 | JP | 2002-175508 A | 6/2002 |
| JP | 11-075329 | A | 3/1999 | JP | 2002-183690 A | 6/2002 |
| JP | 11-085937 | A | 3/1999 | JP | 2002-185358 A | 6/2002 |
| JP | 11-88241 | A | 3/1999 | JP | 2002-204117 A | 7/2002 |
| JP | 11-102424 | A | 4/1999 | JP | 2002-522849 A | 7/2002 |
| JP | 11-103209 | A | 4/1999 | JP | 2002-230128 A | 8/2002 |
| JP | 11-149536 | A | 6/1999 | JP | 2002-232221 A | 8/2002 |
| JP | 11-149537 | A | 6/1999 | JP | 2002-246828 A | 8/2002 |
| JP | 11-149538 | A | 6/1999 | JP | 2002-252117 A | 9/2002 |
| JP | 11-175678 | A | 7/1999 | JP | 2002-259934 A | 9/2002 |
| JP | 11-219420 | A | 8/1999 | JP | 2002-280821 A | 9/2002 |
| JP | 11-220319 | A | 8/1999 | JP | 2002-298109 A | 10/2002 |
| JP | 11-282993 | A | 10/1999 | JP | 2002-308437 A | 10/2002 |
| JP | 11-328352 | A | 11/1999 | JP | 2002-319008 A | 10/2002 |
| JP | 11-331014 | A | 11/1999 | JP | 2002-319009 A | 10/2002 |
| JP | 11-346114 | A | 12/1999 | JP | 2002-319812 A | 10/2002 |
| JP | 11-515094 | A | 12/1999 | JP | 2002-362613 A | 12/2002 |
| JP | 2000-21128 | A | 1/2000 | JP | 2002-366917 A | 12/2002 |
| JP | 2000-021639 | A | 1/2000 | JP | 2002-373029 A | 12/2002 |
| JP | 2000-022421 | A | 1/2000 | JP | 2002-373323 A | 12/2002 |
| JP | 2000-031611 | A | 1/2000 | JP | 2002-374139 A | 12/2002 |
| JP | 2000-059260 | A | 2/2000 | JP | 2003-006599 A | 1/2003 |

| | | | | | | |
|---|---|---|---|---|---|---|
| JP | 2003-016412 A | 1/2003 | | JP | 2005-135132 A | 5/2005 |
| JP | 2003-022912 A | 1/2003 | | JP | 2005-136528 A | 5/2005 |
| JP | 2003-026177 A | 1/2003 | | JP | 2005-137032 A | 5/2005 |
| JP | 2003-030612 A | 1/2003 | | JP | 3653099 B2 | 5/2005 |
| JP | 2003-44789 A | 2/2003 | | JP | 2005-165839 A | 6/2005 |
| JP | 2003-046318 A | 2/2003 | | JP | 2005-167327 A | 6/2005 |
| JP | 2003-58840 A | 2/2003 | | JP | 2005-167813 A | 6/2005 |
| JP | 2003-067711 A | 3/2003 | | JP | 2005-190417 A | 7/2005 |
| JP | 2003-069335 A | 3/2003 | | JP | 2005-191705 A | 7/2005 |
| JP | 2003-076947 A | 3/2003 | | JP | 2005-192124 A | 7/2005 |
| JP | 2003-76963 A | 3/2003 | | JP | 2005-210676 A | 8/2005 |
| JP | 2003-78333 A | 3/2003 | | JP | 2005-210680 A | 8/2005 |
| JP | 2003-078336 A | 3/2003 | | JP | 2005-217822 A | 8/2005 |
| JP | 2003-085501 A | 3/2003 | | JP | 2005-229474 A | 8/2005 |
| JP | 2003-085520 A | 3/2003 | | JP | 2005-236339 A | 9/2005 |
| JP | 2003-87008 A | 3/2003 | | JP | 2005-244778 A | 9/2005 |
| JP | 2003-87044 A | 3/2003 | | JP | 2005-252853 A | 9/2005 |
| JP | 2003-099720 A | 4/2003 | | JP | 2005-275870 A | 10/2005 |
| JP | 2003-099721 A | 4/2003 | | JP | 2005-284352 A | 10/2005 |
| JP | 2003-110344 A | 4/2003 | | JP | 2005-293537 A | 10/2005 |
| JP | 2003-132330 A | 5/2003 | | JP | 2005-295135 A | 10/2005 |
| JP | 2003-134007 A | 5/2003 | | JP | 2005-311205 A | 11/2005 |
| JP | 2003-155062 A | 5/2003 | | JP | 2005-321305 A | 11/2005 |
| JP | 2003-158414 A | 5/2003 | | JP | 2005-322119 A | 11/2005 |
| JP | 2003-168760 A | 6/2003 | | JP | 2005-335755 A | 12/2005 |
| JP | 2003-179565 A | 6/2003 | | JP | 2005-340759 A | 12/2005 |
| JP | 2003-187207 A | 7/2003 | | JP | 2005-345802 A | 12/2005 |
| JP | 2003-187211 A | 7/2003 | | JP | 2005-346820 A | 12/2005 |
| JP | 2003-188338 A | 7/2003 | | JP | 2005-352858 A | 12/2005 |
| JP | 2003-188620 A | 7/2003 | | JP | 2006-013976 A | 1/2006 |
| JP | 2003-198230 A | 7/2003 | | JP | 2006-13976 A | 1/2006 |
| JP | 2003-209421 A | 7/2003 | | JP | 2006-025390 A | 1/2006 |
| JP | 2003-216919 A | 7/2003 | | JP | 2006-031766 A | 2/2006 |
| JP | 2003-218624 A | 7/2003 | | JP | 2006-033312 A | 2/2006 |
| JP | 2003-233780 A | 8/2003 | | JP | 2006-39902 A | 2/2006 |
| JP | 2003-242471 A | 8/2003 | | JP | 2006-039947 A | 2/2006 |
| JP | 2003-243918 A | 8/2003 | | JP | 2006-42059 A | 2/2006 |
| JP | 2003-249813 A | 9/2003 | | JP | 2006-42097 A | 2/2006 |
| JP | 2003-529163 A | 9/2003 | | JP | 2006-053833 A | 2/2006 |
| JP | 2003-288560 A | 10/2003 | | JP | 2006-67479 A | 3/2006 |
| JP | 2003-309418 A | 10/2003 | | JP | 2006-72706 A | 3/2006 |
| JP | 2003-317060 A | 11/2003 | | JP | 2006-074348 A | 3/2006 |
| JP | 2003-331246 A | 11/2003 | | JP | 2006-80367 A | 3/2006 |
| JP | 2003-332820 A | 11/2003 | | JP | 2006-92630 A | 4/2006 |
| JP | 2003-536302 A | 12/2003 | | JP | 2006-102953 A | 4/2006 |
| JP | 2004-040597 A | 2/2004 | | JP | 2006-107296 A | 4/2006 |
| JP | 2004-505481 A | 2/2004 | | JP | 2006-513594 A | 4/2006 |
| JP | 2004-082775 A | 3/2004 | | JP | 2006-148462 A | 6/2006 |
| JP | 2004-88218 A | 3/2004 | | JP | 2006-148518 A | 6/2006 |
| JP | 2004-93693 A | 3/2004 | | JP | 2006-151402 A | 6/2006 |
| JP | 2004-096566 A | 3/2004 | | JP | 2006-174151 A | 6/2006 |
| JP | 2004-126750 A | 4/2004 | | JP | 2006-195795 A | 7/2006 |
| JP | 2004-127230 A | 4/2004 | | JP | 2006-203187 A | 8/2006 |
| JP | 2004-140513 A | 5/2004 | | JP | 2006-203852 A | 8/2006 |
| JP | 2004-213582 A | 7/2004 | | JP | 2006-217000 A | 8/2006 |
| JP | 2004-519916 A | 7/2004 | | JP | 2006-232292 A | 9/2006 |
| JP | 2004-234595 A | 8/2004 | | JP | 2006-237674 A | 9/2006 |
| JP | 2004-253858 A | 9/2004 | | JP | 2006-270212 A | 10/2006 |
| JP | 2004-527864 A | 9/2004 | | JP | 2006-270681 A | 10/2006 |
| JP | 2004-280390 A | 10/2004 | | JP | 2006-270766 A | 10/2006 |
| JP | 2004-282403 A | 10/2004 | | JP | 2006-285911 A | 10/2006 |
| JP | 2004-287767 A | 10/2004 | | JP | 2006-287659 A | 10/2006 |
| JP | 2004-297249 A | 10/2004 | | JP | 2006-295879 A | 10/2006 |
| JP | 2004-297681 A | 10/2004 | | JP | 2006-302219 A | 11/2006 |
| JP | 2004-304370 A | 10/2004 | | JP | 2006-309401 A | 11/2006 |
| JP | 2004-319848 A | 11/2004 | | JP | 2006-311239 A | 11/2006 |
| JP | 2004-326380 A | 11/2004 | | JP | 2006-323481 A | 11/2006 |
| JP | 2004-334268 A | 11/2004 | | JP | 2006-339964 A | 12/2006 |
| JP | 2004-336250 A | 11/2004 | | JP | 2007-007888 A | 1/2007 |
| JP | 2004-343000 A | 12/2004 | | JP | 2007-13120 A | 1/2007 |
| JP | 2004-362190 A | 12/2004 | | JP | 2007-18067 A | 1/2007 |
| JP | 2004-362341 A | 12/2004 | | JP | 2007-28002 A | 2/2007 |
| JP | 2004-362602 A | 12/2004 | | JP | 2007-043535 A | 2/2007 |
| JP | 2005-5866 A | 1/2005 | | JP | 2007-048126 A | 2/2007 |
| JP | 2005-18156 A | 1/2005 | | JP | 2007-65822 A | 3/2007 |
| JP | 2005-033461 A | 2/2005 | | JP | 2007-79687 A | 3/2007 |
| JP | 2005-124061 A | 5/2005 | | JP | 2007-81712 A | 3/2007 |
| JP | 2005-128592 A | 5/2005 | | JP | 2007-096768 A | 4/2007 |
| JP | 2005-129019 A | 5/2005 | | JP | 2007-102348 A | 4/2007 |

| | | | |
|---|---|---|---|
| JP | 2007-116347 A | 5/2007 | |
| JP | 2007-122542 A | 5/2007 | |
| JP | 2007-150642 A | 6/2007 | |
| JP | 2007-150868 A | 6/2007 | |
| JP | 2007-159083 A | 6/2007 | |
| JP | 2007-159129 A | 6/2007 | |
| JP | 2007-166133 A | 6/2007 | |
| JP | 2007-172369 A | 7/2007 | |
| JP | 2007-172527 A | 7/2007 | |
| JP | 2007-228325 A | 9/2007 | |
| JP | 2007-266999 A | 10/2007 | |
| JP | 2007-272264 A | 10/2007 | |
| JP | 2007-287128 A | 11/2007 | |
| JP | 2007-295557 A | 11/2007 | |
| JP | 2007-312350 A | 11/2007 | |
| JP | 2007-324865 A | 12/2007 | |
| JP | 2008-033716 A | 2/2008 | |
| JP | 2008-72243 A | 3/2008 | |
| JP | 2008-083867 A | 4/2008 | |
| JP | 2008-097426 A | 4/2008 | |
| JP | 4069958 B2 | 4/2008 | |
| JP | 2008-103691 A | 5/2008 | |
| JP | 2008-107947 A | 5/2008 | |
| JP | 2008-148345 A | 6/2008 | |
| JP | 2008-519347 A | 6/2008 | |
| JP | 2008-160874 A | 7/2008 | |
| JP | 2008-197714 A | 8/2008 | |
| JP | 2008-217406 A | 9/2008 | |
| JP | 2008-288915 A | 11/2008 | |
| JP | 2009-017284 A | 1/2009 | |
| JP | 2009-25870 A | 2/2009 | |
| JP | 2009-27291 A | 2/2009 | |
| JP | 2009-044715 A | 2/2009 | |
| JP | 3148168 U | 2/2009 | |
| JP | 2009-182630 A | 8/2009 | |
| JP | 2010-009196 A | 1/2010 | |
| JP | 4609604 B2 | 1/2011 | |
| NL | 9100176 A | 3/1992 | |
| NL | 9100347 A | 3/1992 | |
| WO | 98/33142 A1 | 7/1998 | |
| WO | 99/67754 A1 | 12/1999 | |
| WO | 00/10122 A2 | 2/2000 | |
| WO | 01/95242 A2 | 12/2001 | |
| WO | 02/48980 A1 | 6/2002 | |
| WO | 02/061675 A1 | 8/2002 | |
| WO | 02/097723 A1 | 12/2002 | |
| WO | 03/079305 A1 | 9/2003 | |
| WO | 2004/036772 A2 | 4/2004 | |
| WO | 2004/070879 A | 8/2004 | |
| WO | 2004/072892 A2 | 8/2004 | |
| WO | 2005/073937 A | 8/2005 | |
| WO | 2005/091434 A1 | 9/2005 | |
| WO | 2005/115849 A1 | 12/2005 | |
| WO | 2006/045682 A | 5/2006 | |
| WO | 2006/048663 A1 | 5/2006 | |
| WO | 2006/114821 A1 | 11/2006 | |
| WO | 2007/083574 A1 | 7/2007 | |
| WO | 2007/083575 A1 | 7/2007 | |
| WO | 2007/086130 A1 | 8/2007 | |
| WO | 2007/094494 A1 | 8/2007 | |
| WO | 2007/097385 A1 | 8/2007 | |
| WO | 2007/102360 A1 | 9/2007 | |
| WO | 2007/105348 A1 | 9/2007 | |
| WO | 2007/119310 A1 | 10/2007 | |
| WO | 2007/125683 A1 | 11/2007 | |
| WO | 2007/138857 A1 | 12/2007 | |
| WO | 2008/007606 A | 1/2008 | |
| WO | 2008/081699 A1 | 7/2008 | |
| WO | 2008/126458 A1 | 10/2008 | |
| WO | 2008/133018 A1 | 11/2008 | |
| WO | 2008/140037 A1 | 11/2008 | |
| WO | 2008/142957 A1 | 11/2008 | |
| WO | 2009/011144 A1 | 1/2009 | |
| WO | 2009/011376 A1 | 1/2009 | |
| WO | 2009/011400 A1 | 1/2009 | |
| WO | 2009/011423 A1 | 1/2009 | |
| WO | 2009/081719 A1 | 7/2009 | |
| WO | 2009/110381 A1 | 9/2009 | |

OTHER PUBLICATIONS

Official Communication issued in corresponding European Patent Application No. 08739150.4, mailed on May 12, 2010.
Official Communication issued in corresponding Chinese Patent Application No. 200880003176.5, mailed on Sep. 28, 2011.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/057668, mailed on Aug. 17, 2010.
Dokai et al.: "Optical Disc"; U.S. Appl. No. 13/295,153, filed Nov. 14, 2011.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2010/053496, mailed on Jun. 1, 2010.

Ikemoto: "Wireless IC Tag, Reader-Writer, and Information Processing System"; U.S. Appl. No. 13/329,354, filed Dec. 19, 2011.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed on Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19. 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in corresponding Japanese Patent Application No. 2009-512899, mailed on Oct. 25, 2011.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Devic"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.

Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material with Electromagnetic Coupling Module," U.S. Appl. No. 12/536,663, filed Aug. 6, 2009.
Osamura et al.: "Packaging Material with Electromagnetic Coupling Module," U.S. Appl. No. 12/53,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al. "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.

* cited by examiner

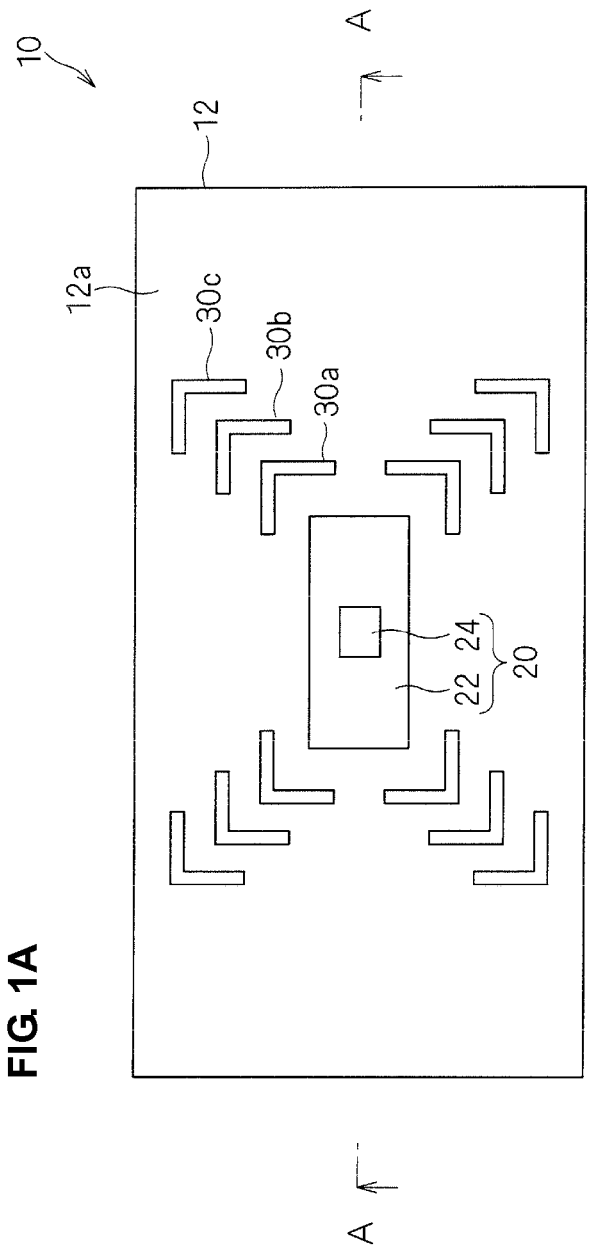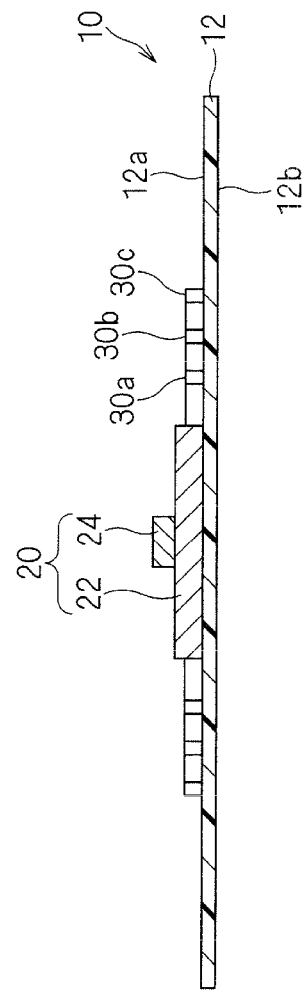

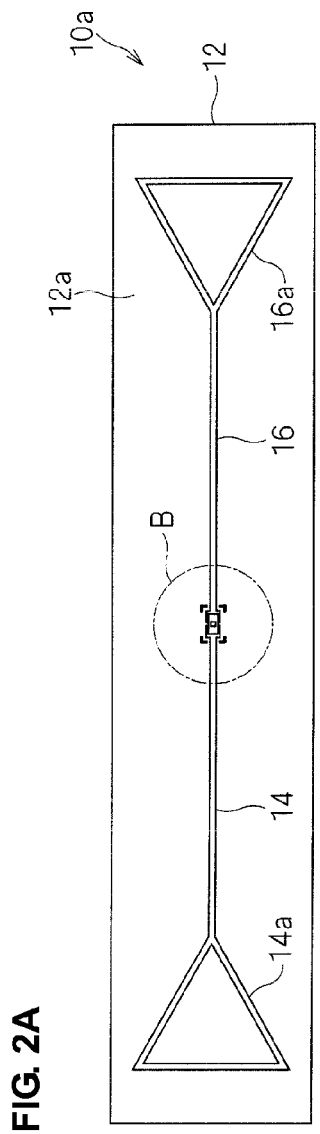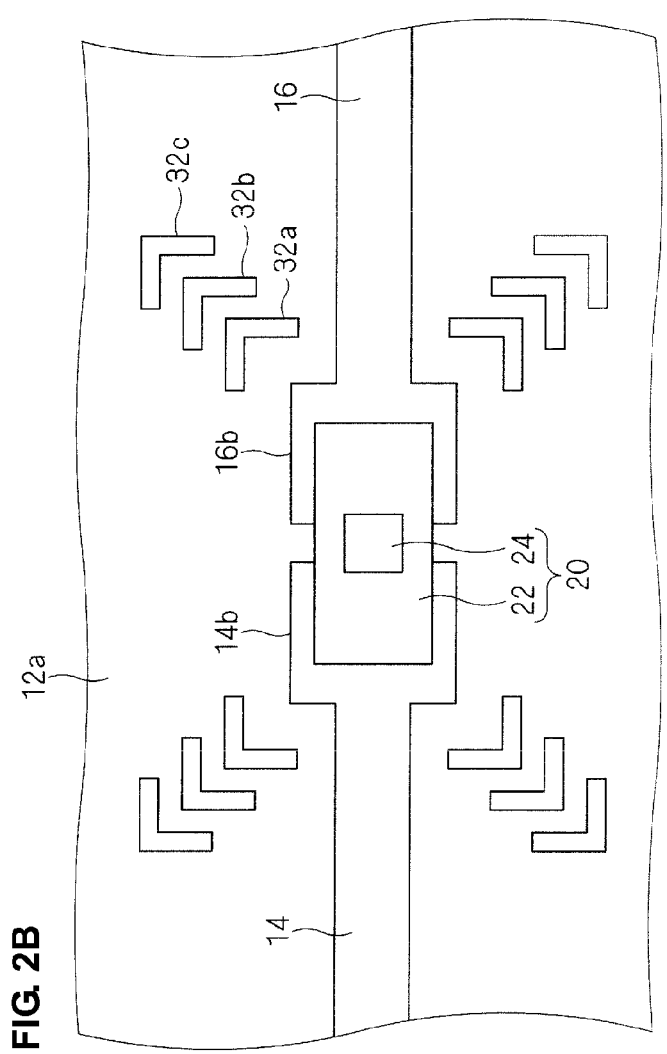

WIRELESS IC DEVICE

BACKGROUND OF THE INVENTION

1. Field of the Invention

The present invention relates to a wireless IC device, and more specifically to a wireless IC device such as a non-contact wireless IC tag used in a RF-ID (Radio Frequency Identification) system, for example.

2. Description of the Related Art

In the related art, there have been proposed wireless IC devices including a wireless IC chip and a radiation plate.

For example, in a non-contact wireless IC tag 100 disclosed in Japanese Unexamined Patent Application Publication No. 2004-280390, as shown in FIG. 7A showing its internal configuration, and FIG. 7B that is a cross-sectional view taken along the portion A-A' of FIG. 7A, a loop antenna 112 is formed as a radiation plate on one principal surface of a resin sheet 115 serving as a substrate, connection terminals 114 are provided at the open end of the loop antenna 112, and a wireless IC chip 111 is mounted on the connection terminals 114 and covered with a surface sheet 120 via an adhesive layer 150 (see, for example, Japanese Unexamined Patent Application Publication No. 2004-280390).

However, in cases where, as in this wireless IC device, the wireless IC chip and the radiation plate need to be connected so as to be electrically continuous with each other, it is necessary to mount the wireless IC chip on the connection terminals with high precision. Thus, high-precision mounting equipment becomes necessary, leading to an increase in manufacturing cost.

In addition, if there is a large displacement of the mounting position of the wireless IC chip with respect to the connection terminals, electrical connection is not established between the wireless IC chip and the radiation plate, so the wireless IC device ceases to function.

Further, in cases where a specification such as communication range varies, if elements having a varying antenna pattern, circuit configuration, and the like are used in accordance with the specification, the manufacturing cost increases.

SUMMARY OF THE INVENTION

In view of the above-mentioned circumstances, preferred embodiments of the present invention provide a wireless IC device which makes it possible to allow a wider tolerance for displacement of the mounting position, and to reduce manufacturing cost.

According a preferred embodiment of the present invention, a wireless IC device includes a wireless IC chip, a feeder circuit board on which the wireless IC chip is located, and in which a feeder circuit having a resonance circuit including an inductance element and/or a matching circuit is disposed, the feeder circuit being electromagnetically coupled to a radiation plate, and a substrate on which the feeder circuit board is located. On the substrate, a plurality of positioning markers are arranged to indicate a plurality of positioning areas in which the feeder circuit board is selectively placed.

In the above-mentioned configuration, the radiation plate may be placed either on the substrate itself or outside of the substrate. In the latter case, the substrate is placed in a predetermined position with respect to the radiation plate.

According to the above-mentioned configuration, since the resonance circuit disposed in the feeder circuit board is electromagnetically coupled to the radiation plate, a wider tolerance is allowed for displacement of the mounting position as compared with a case in which the feeder circuit board is brought into electrical continuity with the radiation plate. The feeder circuit board supplies power to the wireless IC by using, for example, an induced current produced when the electromagnetic field generated by the radiation plate upon receiving radio waves is coupled to the inductance element.

According to the above-mentioned configuration, a positioning area can be selected in accordance with a desired communication range or radiation intensity, and the feeder circuit board can be mounted to the substrate by an appropriate method by using the corresponding positioning marker. For example, when the positioning area is narrow, the feeder circuit board is mounted to the substrate with high precision by using mounting equipment. On the other hand, when the positioning area is wide, the feeder circuit board is manually mounted to the substrate.

Since a plurality of required specifications can be handled by simply changing the mounting position of the feeder circuit board on the substrate, and a predetermined mounting method can be selected in accordance with a desired communication range, a reduction in manufacturing cost can be achieved.

In addition, since a wireless IC device can be determined as non-defective if the feeder circuit board is mounted inside a predetermined positioning marker, a mounting failure can be determined easily and in a short time.

Preferably, the substrate has a sheet-shaped configuration, for example.

The use of a sheet-shaped substrate allows for continuous and efficient manufacture, and also facilitates miniaturization.

Preferably, the positioning markers are concentric closed figures, for example.

If the positioning markers are closed figures, it is easy to determine whether or not the feeder circuit board is placed inside a predetermined positioning marker, and a mounting failure of the feeder circuit board can be determined in a shorter time and more easily.

Preferably, an adhesive layer is placed between the feeder circuit board and the substrate, and an upper surface of the adhesive layer is spaced at a distance from the substrate as far as or farther than an upper surface of the positioning markers.

In this case, by placing the feeder circuit board on the flat upper surface of the adhesive layer, it is possible to prevent the feeder circuit board from tilting even when the feeder circuit board is placed on the positioning markers.

Preferably, the positioning markers are formed on a principal surface of the substrate on which the feeder circuit board is placed.

In this case, if an adhesive is used when mounting the feeder circuit board to the substrate, it is possible to prevent the adhesive from sticking out toward the outside of a predetermined positioning marker.

Preferably, the substrate has the radiation plate disposed on a principal surface on which the feeder circuit board is placed.

In this case, since the radiation plate is disposed on the substrate itself, it is not necessary to perform the operation of placing the substrate in a predetermined position with respect to the radiation plate as is the case when the radiation plate is located outside of the substrate.

In addition, the distance between the feeder circuit board and the radiation plate can be made short for efficient electromagnetic coupling, thereby facilitating miniaturization.

Since the radiation plate is preferably formed of a conductive material, to prevent an adverse electrical or magnetic influence, the positioning markers are preferably formed of an insulating material.

Preferably, the substrate has the radiation plate disposed on a principal surface different from a principal surface on which the feeder circuit board is disposed.

In this case, since the radiation plate is provided on the substrate itself, it is not necessary to perform the operation of placing the substrate in a predetermined position with respect to the radiation plate as is the case when the radiation plate is placed outside of the substrate.

In addition, since the positioning markers and the radiation plate are located on different principal surfaces of the substrate, the positioning markers can be also formed by using the same conductive material as that of the radiation plate. In this case, there is no need to prepare insulating resin or the like for the positioning markers, thereby achieving a reduction in cost due to a reduction in the number of components.

According to various preferred embodiments of the present invention, through electromagnetic coupling between the feeder circuit board and the radiation plate, a wider tolerance is allowed for displacement of the mounting position. In addition, by mounting the feeder circuit board to the substrate by using a positioning marker selected in accordance with a required specification, commonality of constituent parts can be achieved to reduce manufacturing cost.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 1A and 1B are a plan view and a cross-sectional view, respectively, of a wireless IC device according to Preferred Embodiment 1 of the present invention.

FIGS. 2A and 2B are a plan view and an enlarged main-portion plan view, respectively, of a wireless IC device, according to Preferred Embodiment 2 of the present invention.

DETAILED DESCRIPTION OF THE PREFERRED EMBODIMENTS

Figure 3A:
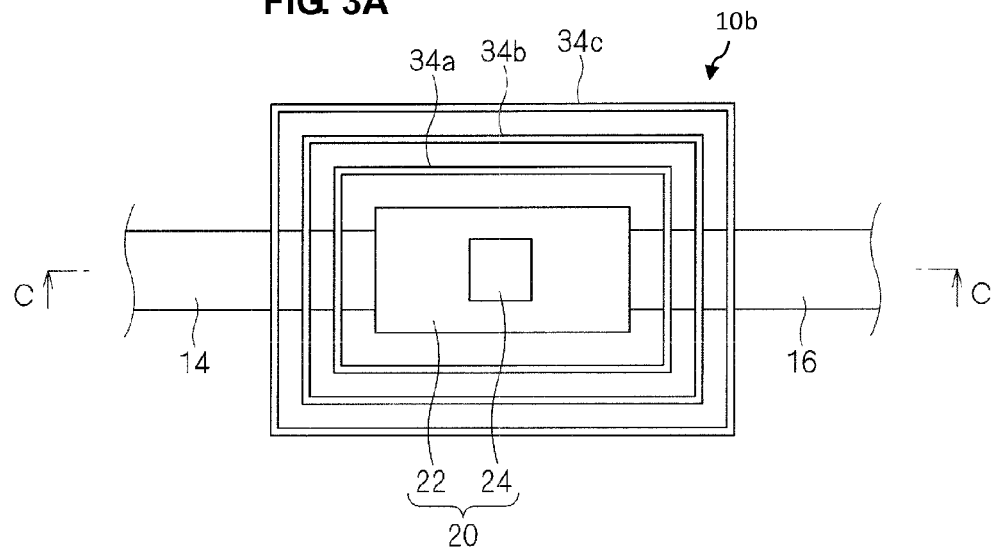
FIG. 3A is a main-portion plan view of a wireless IC device.

Hereinbelow, as the modes for carrying out the present invention, preferred embodiments will be described with reference to FIGS. 1 to 6.

Preferred Embodiment 1

A wireless IC device according to Preferred Embodiment 1 will be described with reference to FIGS. 1A and 1B. FIG. 1A is a plan view of a wireless IC device 10. FIG. 1B is a cross-sectional view taken along the line A-A of FIG. 1A.

As shown in FIG. 1, in the wireless IC device 10, an electromagnetic coupling module 20 including a feeder circuit board 22 and a wireless IC chip 24 is mounted on an upper surface 12a that is one principal surface of a substrate 12. For example, use of sheet-shaped resin for the substrate 12 allows for continuous and efficient manufacture, and also facilitates miniaturization.

A lower surface 12b as the other principal surface of the substrate 12 of the wireless IC device 10 is bonded to, although not shown, a predetermined position of a member to be bonded to which has a radiation plate placed thereon. The electromagnetic coupling module 20 is thus placed in a predetermined position with respect to the radiation plate.

When the electromagnetic coupling module 20 is placed in a predetermined position with respect to the radiation plate, the wireless IC device 10 functions as a wireless IC device.

The electromagnetic coupling module 20 is fixed to the upper surface 12a of the substrate 12 by using, for example, an adhesive, after the wireless IC chip 24 is installed on the feeder circuit board 22 in advance, for example.

For example, the feeder circuit board 22 of the electromagnetic coupling module 20 is a multilayer board, with a resonance circuit including an inductor pattern (that is, an inductance element) disposed inside or outside thereof. This inductor pattern and the radiation plate are electromagnetically coupled to each other. Since the feeder circuit board 22 and the radiation plate need not be connected so as to be in electrically continuity with each other, the electromagnetic coupling module 20 can be fixed to the substrate 12 by using an insulating adhesive, for example.

The feeder circuit board 22 supplies electric power to the wireless IC chip 24 via an induced current produced in the inductor pattern in response to a magnetic field generated by the radiation plate upon receiving radio waves. That is, energy received by the feeder circuit board 22 is impedance-matched to the wireless IC chip 24, thereby supplying electric power to the wireless IC chip 24.

In addition, the feeder circuit board 22 relays signals between the wireless IC chip 24 and the radiation plate via the inductor pattern.

Four sets, for example, of substantially L-shaped positioning markers 30a, 30b, and 30c are preferably formed on the upper surface 12a of the substrate 12. The positioning markers 30a, 30b, and 30c indicate the boundaries of a plurality of positioning areas in which the electromagnetic coupling module 20 is selectively placed.

A positioning area can be selected in accordance with a desired communication range or radiation intensity, and the electromagnetic coupling module 20 is placed for electromagnetic coupling inside the boundary of the positioning area indicated by the corresponding positioning markers 30a, 30b, or 30c. By placing the electromagnetic coupling module 20 inside a predetermined positioning area, the gain of the wireless IC chip 24 is set within a predetermined range.

In a case where, as shown in FIG. 1, the electromagnetic coupling module 20 is placed at the approximate center of the positioning markers 30a, 30b, and 30c that are arranged concentrically, when the wireless IC device 10 is placed in a predetermined position of the member to be bonded to (not shown), the electromagnetic coupling between the feeder circuit board 22 and the radiation plate becomes strongest, and the communication range or radiation intensity becomes maximum. In this case, since it is necessary to mount the electromagnetic coupling module 20 on the substrate 12 with high precision, for example, mounting equipment is used.

On the other hand, as the placement position of the electromagnetic coupling module 20 becomes farther from the center of the positioning markers 30a, 30b, and 30c, the electromagnetic coupling between the feeder circuit board 22 and the radiation plate becomes weaker, the radiation intensity becomes lower, and the communication range becomes shorter. In cases where the positioning area in which the electromagnetic coupling module 20 is to be mounted is wide, such as when a short communication range suffices, the electromagnetic coupling module 20 can be mounted manually, for example.

A plurality of required specifications can be handled by simply selecting the positioning markers 30a, 30b, or 30c to be used as marks indicating the mounting area of the electromagnetic coupling module 20, and changing the position of the substrate 12 in which the electromagnetic coupling module 20 is mounted. Since there is no need to manufacture different parts for individual specifications, a reduction in manufacturing cost can be achieved.

Preferred Embodiment 2

A wireless IC device 10a according to Preferred Embodiment 2 will be described with reference to FIGS. 2A and 2B. FIG. 2A is a plan view of the wireless IC device 10a. FIG. 2B is an enlarged plan view showing the portion indicated by the chain line B in FIG. 2A.

As shown in FIGS. 2A and 2B, in the wireless IC device 10a, as in Preferred Embodiment 1, the electromagnetic coupling module 20 including the feeder circuit board 22 and the wireless IC chip 24 is mounted on the upper surface 12a of the substrate 12.

Unlike in Preferred Embodiment 1, the substrate 12 is elongated, and radiation plates 14 and 16 are located on the upper surface 12a of the substrate 12. The radiation plates 14 and 16 are preferably arranged so as to be bilaterally symmetrical. First ends 14b and 16b of the radiation plates 14 and 16 are arranged in close proximity to each other near the center of the substrate 12, and second ends 14a and 16a are arranged on opposite end sides of the substrate 12. The second ends 14a and 16a of the radiation plates 14 and 16 preferably have a loop shape.

The first ends 14b and 16b of the radiation plates 14 and 16 preferably have a rectangular shape. The feeder circuit board 22 of the electromagnetic coupling module 20 is fixed onto the first ends 14b and 16b via, for example, an adhesive in such a way as to define a bridge between the first ends 14b and 16b of the radiation plates 14 and 16. The feeder circuit board 22 and the first ends 14b and 16b of the radiation plates 14 and 16 are electromagnetically coupled to each other.

As in Preferred Embodiment 1, on the upper surface 12a of the substrate 12, there are preferably formed four sets of substantially L-shaped positioning markers 32a, 32b, and 32c indicating the boundaries of a plurality of positioning areas in which the electromagnetic coupling module 20 is selectively placed. A plurality of required specifications can be handled by simply selecting the positioning markers 32a, 32b, or 32c to be used as marks indicating the mounting areas, and mounting the electromagnetic coupling module 20 on the substrate 12 inside an area formed by extending and connecting the lines of the positioning markers 32a, 32b, or 32c. Since there is no need to manufacture different parts for individual specifications, a reduction in manufacturing cost can be achieved.

Unlike in Preferred Embodiment 1, when the electromagnetic coupling module 20 is placed at the approximate center of the positioning markers 32a, 32b, and 32c as shown in FIG. 2B, the first ends 14b and 16b of the radiation plates 14 and 16 stick out around the periphery of the feeder circuit board 22. That is, the first ends 14b, 16b of the radiation plates 14 and 16 are formed with a margin of extra area. Therefore, even if the electromagnetic coupling module 20 is placed slightly off the center of the positioning markers 32a, 32b, and 32c, the electromagnetic coupling module 20 is electromagnetically coupled to the first ends 14b and 16b of the radiation plates 14 and 16 in a satisfactory manner to ensure a certain level of antenna gain or higher. Therefore, the mounting of the electromagnetic coupling module 20 becomes easier than in Preferred Embodiment 1.

Preferred Embodiment 3

Figure 3B:
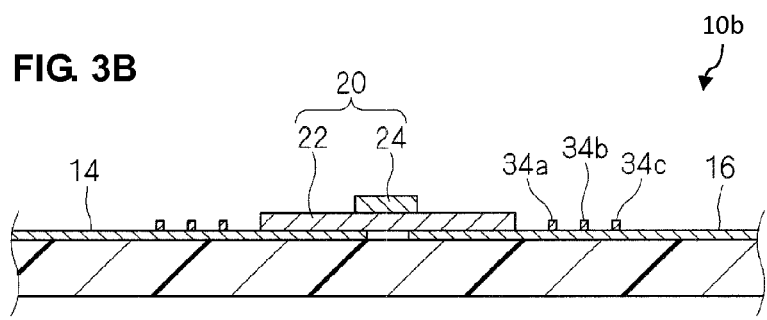
FIG. 3B is a main-portion cross-sectional view of the wireless IC device.
Figure 3C:
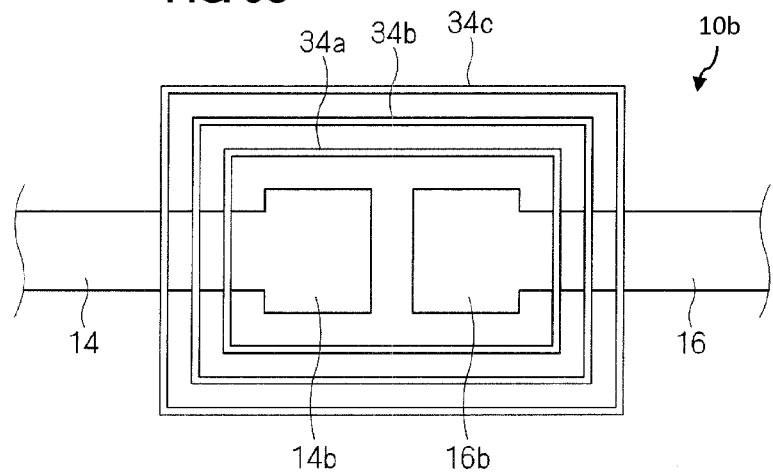
FIG. 3C is a main-portion plan view of a substrate according to Preferred Embodiment 3 of the present invention.

A wireless IC device 10b according to Preferred Embodiment 3 will be described with reference to FIGS. 3A-3C and 4. FIG. 3A is a main-portion plan view of the wireless IC device 10b. FIG. 3B is a main-portion cross-sectional view taken along the line C-C in FIG. 3A. FIG. 3C is a main-portion plan view of a substrate.

As shown in FIGS. 3A-3C, in the wireless IC device 10b, as in Preferred Embodiment 1, the electromagnetic coupling module 20 including the feeder circuit board 22 and the wireless IC chip 24 is mounted on the upper surface 12a of the substrate 12 made of sheet-shaped resin, and the feeder circuit board 22 of the electromagnetic coupling module 20 is located near the first ends 14b and 16b of the radiation plates 14 and 16 which preferably have a rectangular shape.

Unlike in Preferred Embodiment 2, on the upper surface 12a of the substrate 12, one set of substantially L-shaped positioning markers 34a, 34b, and 34c are arranged to indicate the boundaries of a plurality of positioning areas in which the electromagnetic coupling module 20 is selectively placed. Each of the positioning markers 34a, 34b, and 34c preferably is formed as a closed figure whose four sides are connected in a rectangular shape so as to be continuous.

Since the positioning markers 34a, 34b, and 34c cross the radiation plates 14 and 16 preferably formed of a conductive material, the positioning markers 34a, 34b, and 34c are preferably formed of an insulating material such as insulating resin.

When the electromagnetic coupling module 20 is placed at the approximate center of the positioning markers 34a, 34b, and 34c as shown in FIG. 3A, the first ends 14b and 16b of the radiation plates 14 and 16 do not stick out around the periphery of the feeder circuit board 22. That is, the first ends 14b, 16b of the radiation plates 14 and 16 are formed without a margin of extra area.

Figure 4A:
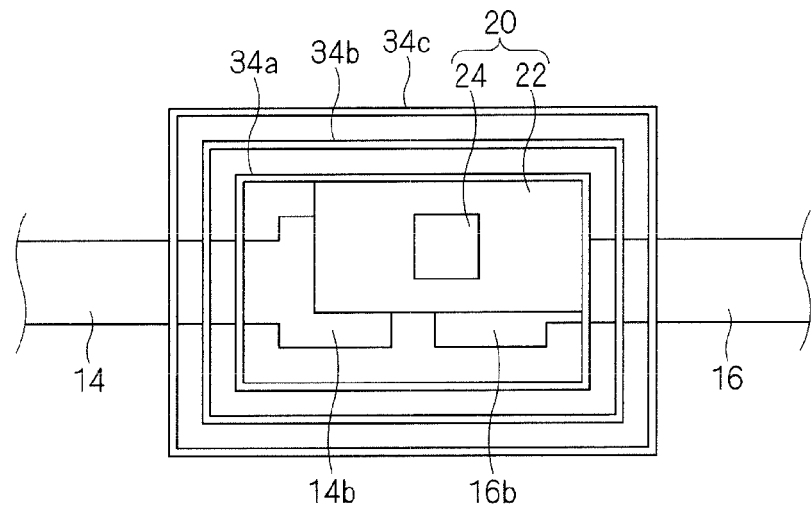
FIGS. 4A-4C are main-portion plan views showing how an electromagnetic coupling module is placed according to a preferred embodiment of the present invention.
Figure 4B:
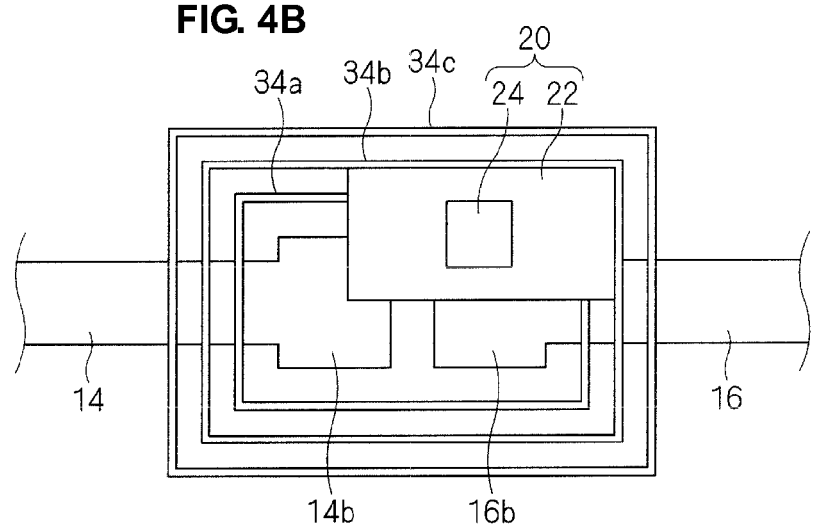
Figure 4C:
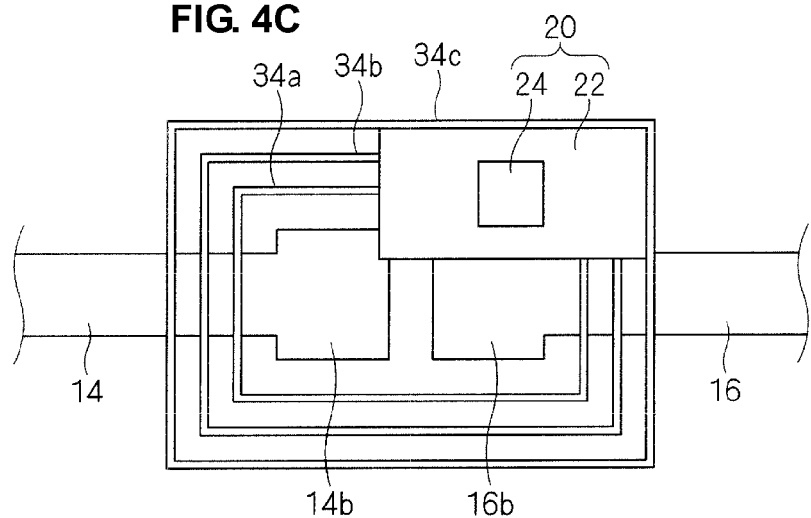

As shown in the plan view of FIGS. 4A-4C, the electromagnetic coupling module 20 can be placed in different positions by using the positioning markers 34a, 34b, and 34c.

When, as shown in FIG. 4A, the electromagnetic coupling module 20 is placed inside the smallest positioning marker 34a, for example, the radiation gain becomes about 1.3 dB at 910 MHz, so the characteristics are excellent, and the communication range becomes long range.

When, as shown in FIG. 4B, the electromagnetic coupling module 20 is placed beyond and outside the smallest positioning marker 34a, and inside the mid-sized positioning marker 34b, for example, the radiation gain becomes about −3.5 dB at 910 MHz, so the characteristics are medium, and the communication range also becomes medium range.

When, as shown in FIG. 4C, the electromagnetic coupling module 20 is placed beyond and outside the mid-sized positioning marker 34b, and inside the largest positioning marker 34c, for example, the radiation gain becomes about −10.0 dB at 910 MHz, so the characteristics are poor, and the communication range becomes short range.

In cases where the wireless IC device according to Preferred Embodiment 3 is to be used for applications in which the distance (communication range) to a reader as a reading device for reading data stored in the wireless IC chip 24 is long, the electromagnetic coupling module 20 is accurately mounted side the smallest positioning marker 34a by using mounting equipment. On the other hand, for applications in which the distance (communication range) to the reader is short, the electromagnetic coupling module 20 is mounted manually by using the other positioning markers 34b and 34c as marks. In this case, since the required mounting precision can be made lower than that in the case of using mounting equipment, the mounting cost can be reduced.

If mounting of the electromagnetic coupling module 20 is performed on the user side, the mounting method or mounting precision can be selected as appropriate in accordance with the user's circumstances.

In addition, if the positioning markers 34a, 34b, and 34c are closed figures, it is easy to determine whether or not the electromagnetic coupling module 20 is placed inside a predetermined one of the positioning markers 34a, 34b, and 34c, and a mounting failure of the electromagnetic coupling module 20 can be determined in a shorter time and more easily.

Moreover, in cases where an adhesive is used for bonding the electromagnetic coupling module 20 to the substrate 12, since the positioning markers 34a, 34b, and 34c are closed figures, it is possible to prevent the adhesive from sticking out toward the outside of a predetermined positioning marker.

Modifications of Preferred Embodiments

There are cases where, as shown in FIGS. 4B and 4C, and feeder circuit board 22 of the electromagnetic coupling module 20 is mounted on the positioning markers 34a and 34b. In such cases, since the positioning markers 34a and 34b preferably have a certain thickness, depending on the mounting position, problems can arise such that the feeder circuit board 22 is mounted in a tilted state.

Figure 6:
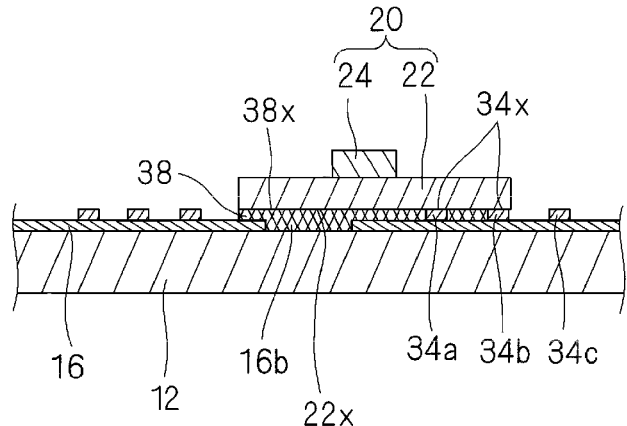
FIG. 6 is a cross-sectional view of a wireless IC device according to a modification of a preferred embodiment of the present invention.
Figure 7A:
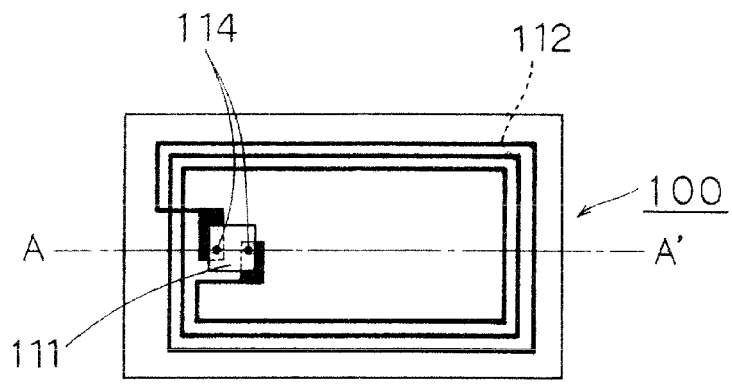
FIGS. 7A and 7B are an internal configuration view and a cross-sectional view, respectively, of a known wireless IC device.
Figure 7B:
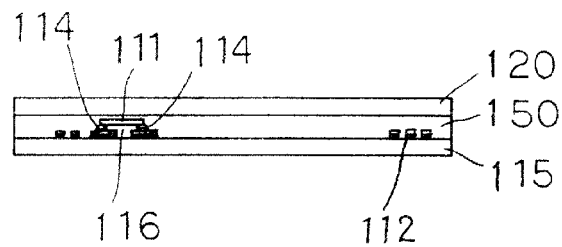

To overcome such problems, as shown in the cross-sectional view of FIG. 6, an adhesive layer 38 used at the time of bonding the feeder circuit board 22 of the electromagnetic coupling module 20 to the substrate 12 preferably has a thickness equal to or larger than the thickness of the positioning markers 34a and 34b. That is, the adhesive layer 38 is formed in such a way that an upper layer 38x of the adhesive layer 38 placed between the feeder circuit board 22 and the substrate 12 is spaced at a distance from the substrate 12 as far as or farther than an upper surface 34x of the positioning markers 34a and 34b.

Accordingly, by placing the feeder circuit board 22 on the flat upper surface 38x of the adhesive layer 38, it is possible to prevent the feeder circuit board 22 from tilting even when the feeder circuit board 22 is mounted on the positioning markers 34a and 34b.

Preferred Embodiment 4

Figure 5A:
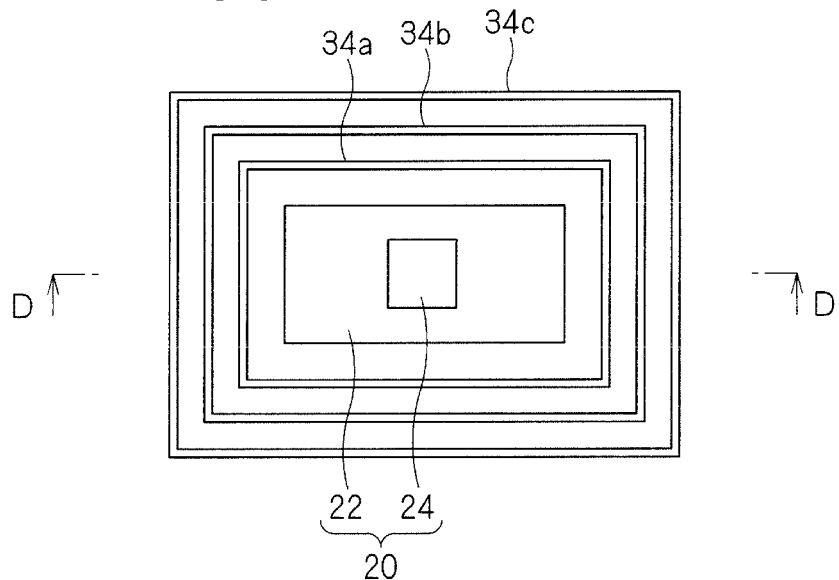
FIG. 5A is a main-portion plan view of a wireless IC device.
Figure 5B:
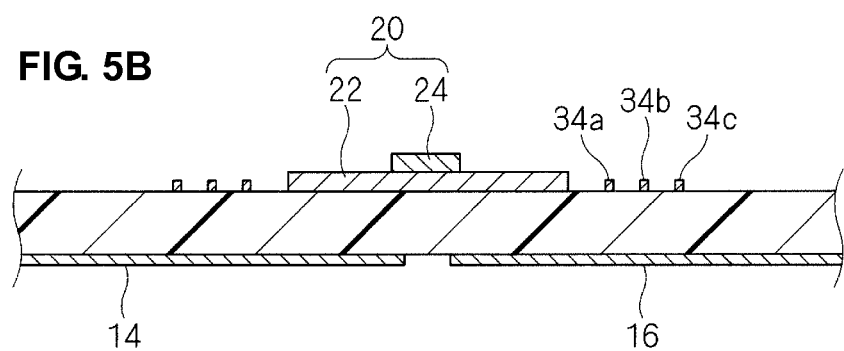
FIG. 5B is a main-portion cross-sectional view of the wireless IC device.
Figure 5C:
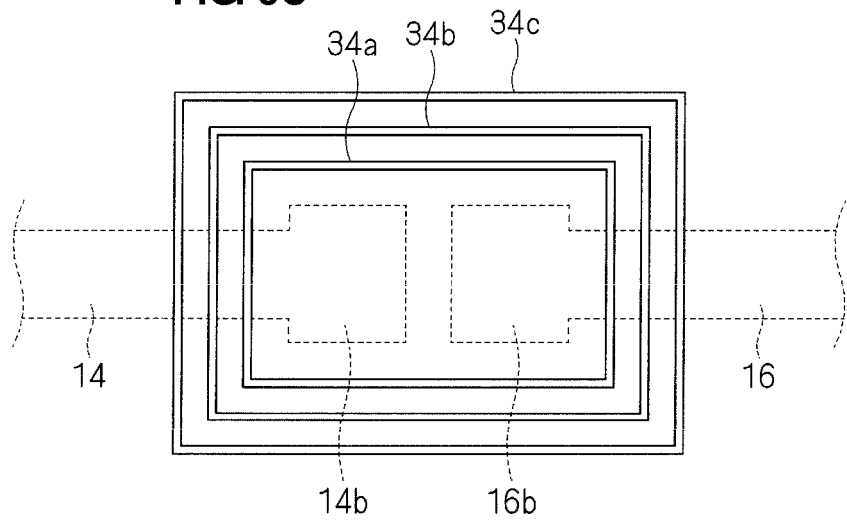
FIG. 5C is a main-portion plan view of a substrate according to Preferred Embodiment 4 of the present invention.

A wireless IC device according to Preferred Embodiment 4 will be described with reference to FIGS. 5A-5C. FIG. 5A is a main-portion plan view of the wireless IC device. FIG. 5B is a main-portion cross-sectional view taken along the line D-D in FIG. 5A. FIG. 5C is a main-portion plan view of a substrate.

As shown in FIGS. 5A-5C, as in the wireless IC device according to Preferred Embodiment 3, in the wireless IC device according to Preferred Embodiment 4, there is formed, on the upper surface 12a of the substrate 12, one set of positioning markers 34a, 34b, and 34c that are closed figures (rectangles defined by four sides) indicating the boundaries of a plurality of positioning areas in which the electromagnetic coupling module 20 is selectively placed.

Unlike in Preferred Embodiment 3, the radiation plates 14 and 16 are disposed on the lower surface 12b of the substrate 12. Since the positioning markers 34a, 34b, and 34c and the radiation plates 14 and 16 are provided on different surfaces 12a and 12b of the substrate 12, respectively, the positioning markers 34a, 34b, and 34c can be formed by using the same conductive material as that of the radiation plates 14 and 16. In this case, there is no need to prepare insulating resin or the like for the positioning markers, thereby achieving a reduction in cost due to a reduction in the number of components.

As described above with respect to various preferred embodiments of the present invention, since the feeder circuit board is electromagnetically coupled to the radiation plate, a wider tolerance is allowed for displacement of the mounting position as compared with a case in which the feeder circuit board is brought into electrical continuity with the radiation plate. In addition, by selecting a positioning marker in accordance with a required specification such as communication range, and selecting a mounting method, the manufacturing cost can be reduced.

It should be noted that the present invention is not limited to the above-mentioned Preferred Embodiments but can be implemented with various modifications.

For example, the shape of the positioning markers according to Preferred Embodiment 1 is not limited to an L shape but may be an arcuate shape or other suitable shape. Also, the shape of the positioning markers according to Preferred Embodiment 3 is not limited to a rectangular shape but may be an elliptical shape or other suitable shape.

The feeder circuit of the feeder circuit board may be configured such that (a) the feeder circuit has a resonance circuit including an inductance element, and also a matching circuit, (b) the feeder circuit has a matching circuit, but does not have a resonance circuit including an inductance element, or (c) the feeder circuit does not have a matching circuit, but has a resonance circuit including an inductance element.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
   a wireless IC chip;
   a feeder circuit board on which the wireless IC chip is disposed, and including a feeder circuit including at least one of a resonance circuit and a matching circuit, the feeder circuit being electromagnetically coupled to a pair of radiation plates; and
   a substrate on which the feeder circuit board is placed and including the pair of radiation plates disposed thereon or therein; wherein
   a plurality of positioning markers are provided on the substrate, the plurality of positioning markers being concentric figures and arranged at different areas of the substrate that define a plurality of positioning areas in which the feeder circuit board can be selectively placed with respect to the pair of radiation plates to provide the wireless IC device with a desired communication range or a desired radiation intensity;

the pair of radiation plates are arranged adjacent to each other; and the plurality of positioning markers surround one end portion of each of the pair of radiation plates when the plurality of positioning markers are viewed in plan view.

2. The wireless IC device according to claim 1, wherein the substrate has a sheet-shaped configuration.

3. The wireless IC device according to claim 1, wherein the positioning markers are concentric closed figures.

4. The wireless IC device according to claim 1, wherein the positioning markers are provided on a principal surface of the substrate on which the feeder circuit board is placed.

5. The wireless IC device according to claim 1, wherein an adhesive layer is located between the feeder circuit board and the substrate, and an upper surface of the adhesive layer is spaced at a distance from the substrate as far as or farther than an upper surface of the positioning markers.

6. The wireless IC device according to claim 2, wherein the pair of radiation plates are disposed on a principal surface of the substrate on which the feeder circuit board is placed.

7. The wireless IC device according to claim 2, wherein the pair of radiation plates are disposed on a principal surface of the substrate different from a principal surface on which the feeder circuit board is provided.

8. The wireless IC device according to claim 1, wherein the feeder circuit is electrically coupled with the pair of radiation plates.

9. The wireless IC device according to claim 1, wherein the feeder circuit is magnetically coupled with the pair of radiation plates.

10. The wireless IC device according to claim 1, wherein the feeder circuit is electrically and magnetically coupled with the pair of radiation plates.

11. The wireless IC device according to claim 1, wherein the resonance circuit includes one of an inductance element or a matching circuit.

12. The wireless IC device according to claim 1, wherein the resonance circuit includes an inductance element and a matching circuit.

* * * * *